United States Patent
Song et al.

(10) Patent No.: US 7,822,153 B2
(45) Date of Patent: Oct. 26, 2010

(54) AUTOMATIC GAIN CONTROL APPARATUS AND METHOD IN AN ORTHOGONAL FREQUENCY DIVISION MULTIPLE ACCESS SYSTEM

(75) Inventors: Yong-Chul Song, Seoul (KR); Young-Mo Gu, Suwon-si (KR); Min-Goo Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1241 days.

(21) Appl. No.: 11/348,345

(22) Filed: Feb. 7, 2006

(65) Prior Publication Data

US 2006/0176093 A1 Aug. 10, 2006

(30) Foreign Application Priority Data

Feb. 7, 2005 (KR) .................. 10-2005-0011193

(51) Int. Cl.
*H04L 27/06* (2006.01)
(52) U.S. Cl. .................... 375/345; 375/316
(58) Field of Classification Search .......... 375/316, 375/326, 327, 341, 345; 455/250.1, 240.1, 455/232.1
See application file for complete search history.

(56) References Cited

U.S. PATENT DOCUMENTS

| | | | | |
|---|---|---|---|---|
| 5,563,916 | A * | 10/1996 | Scarpa | 375/345 |
| 6,510,188 | B1 * | 1/2003 | Isaksen et al. | 375/345 |
| 6,735,420 | B2 * | 5/2004 | Baldwin | 455/127.2 |
| 6,843,597 | B1 * | 1/2005 | Li et al. | 375/345 |
| 7,184,730 | B2 * | 2/2007 | Hughes et al. | 455/240.1 |
| 7,302,022 | B2 * | 11/2007 | Kim et al. | 375/345 |
| 7,415,083 | B2 * | 8/2008 | Anderson | 375/345 |
| 2002/0186799 | A1 * | 12/2002 | Sayeed | 375/345 |
| 2003/0123574 | A1 * | 7/2003 | Simeon et al. | 375/340 |
| 2003/0162518 | A1 * | 8/2003 | Baldwin et al. | 455/253.2 |
| 2003/0194029 | A1 | 10/2003 | Heinonen | |
| 2003/0227986 | A1 * | 12/2003 | Filipovic | 375/345 |
| 2004/0100898 | A1 * | 5/2004 | Anim-Appiah et al. | 370/210 |
| 2004/0229581 | A1 * | 11/2004 | Mizoguchi et al. | 455/136 |
| 2005/0208897 | A1 * | 9/2005 | Lyons et al. | 455/67.11 |

(Continued)

FOREIGN PATENT DOCUMENTS

EP 1650890 4/2006

(Continued)

*Primary Examiner*—Emmanuel Bayard
(74) *Attorney, Agent, or Firm*—Roylance, Abrams, Berdo & Goodman, L.L.P.

(57) ABSTRACT

An automatic gain control (AGC) apparatus of a wireless mobile terminal, and method, in an orthogonal frequency division multiple access (OFDMA) system. A gain amplifier controls an amplification gain of received analog symbols. An analog-to-digital converter converts the received analog symbols into a digital signal. A fast Fourier transform (FFT) unit converts the digital signal into a frequency-domain signal. A power measurer measures power in the frequency domain in units of sub-carriers. A sub-carrier power accumulator detects a sub-carrier carrying a signal, and accumulates its power value. A sub-carrier average power measurer estimates an average power value transmitted per sub-carrier from the accumulated power value. A control means compares the estimated average power value with a reference power value, and generates a control signal used for controlling a gain of the gain amplifier according to the comparison result.

23 Claims, 7 Drawing Sheets

U.S. PATENT DOCUMENTS

2005/0276359 A1* 12/2005 Xiong .................. 375/345
2007/0297525 A1* 12/2007 Wu et al. ............... 375/260
2008/0317110 A1* 12/2008 Sedarat ................. 375/226

FOREIGN PATENT DOCUMENTS

| KR | 2002-0090562 | 12/2002 |
|---|---|---|
| WO | 2005-011165 | 2/2005 |

\* cited by examiner

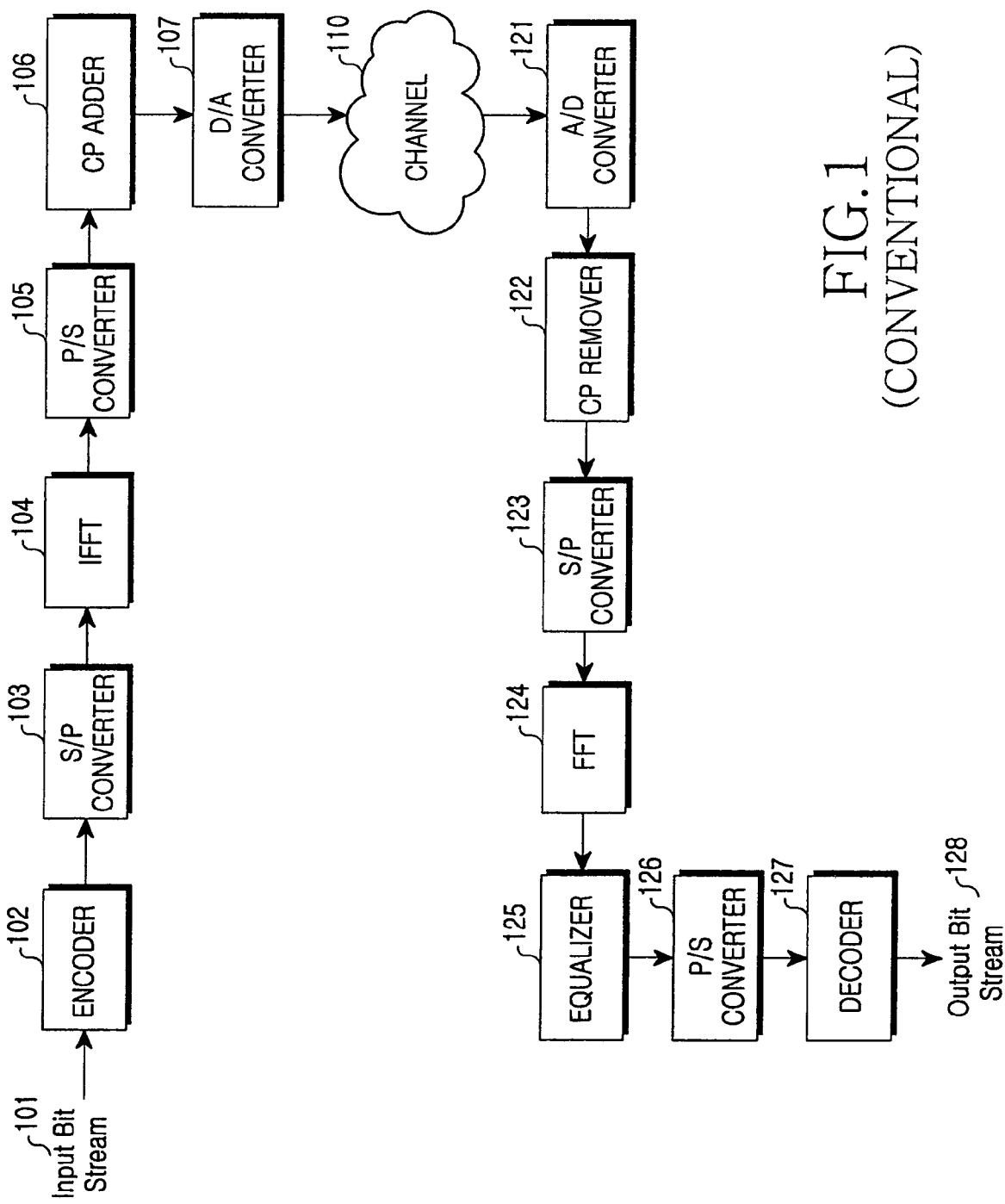
FIG. 1
(CONVENTIONAL)

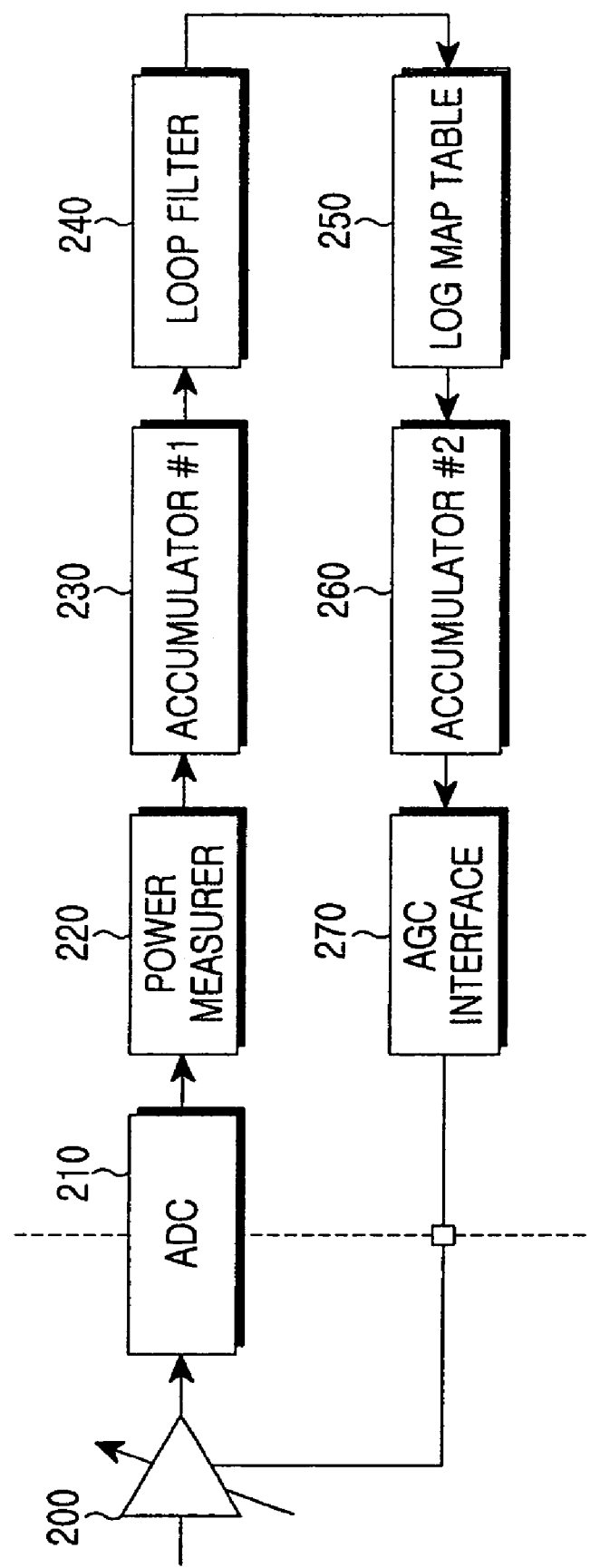
FIG.2
(CONVENTIONAL)

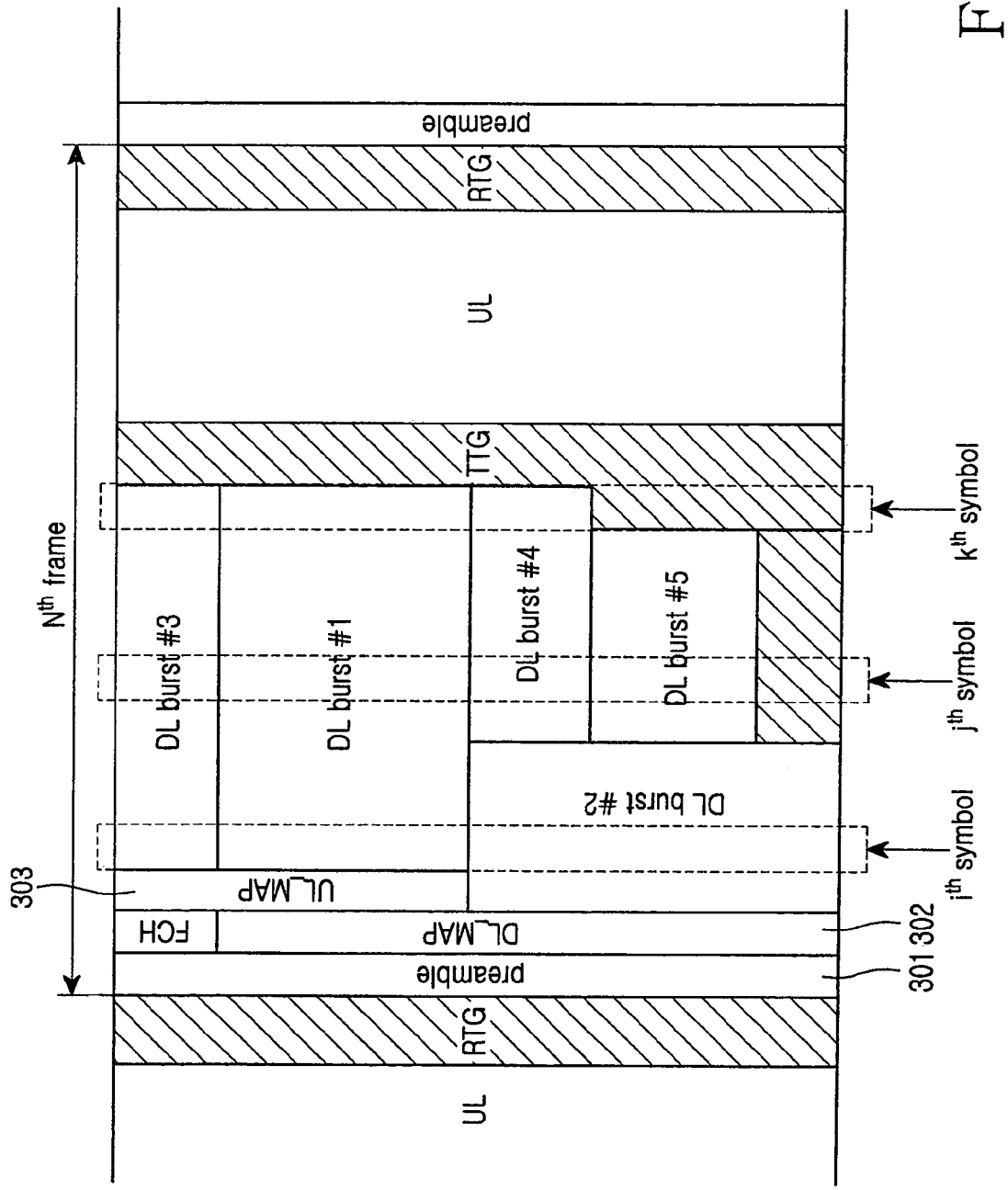
FIG.3
(CONVENTIONAL)

AUTOMATIC GAIN CONTROL APPARATUS AND METHOD IN AN ORTHOGONAL FREQUENCY DIVISION MULTIPLE ACCESS SYSTEM

CROSS-REFERENCE TO RELATED APPLICATIONS

This application claims the benefit under 35 U.S.C. §119 (a) of a Korean Patent Application Serial No. 2005-11193 filed in the Korean Intellectual Property Office on Feb. 7, 2005, the entire contents of which are hereby incorporated by reference.

BACKGROUND OF THE INVENTION

1. Field of the Invention

The present invention relates generally to an automatic gain control (AGC) apparatus and method in a communication system. In particular, the present invention relates to an apparatus and method for performing AGC to maintain received signal power uniformly in an Orthogonal Frequency Division Multiple Access (OFDMA) wireless communication system.

2. Description of the Related Art

A conventional wireless communication system is typically a voice service-oriented mobile communication system. With the development of communication industry and the increasing user demand for Internet service, the wireless communication system is evolving into an advanced communication system capable of supporting high-speed data transmission. However, the wireless communication system, originally developed to mainly provide the voice service, has reached a limit in transmitting a large volume of data due to the exhaustion of data transmission bandwidth and resource. Therefore, conventional Code Division Multiple Access (CDMA) mobile communication system cannot fully meet the demands in the modern society requiring a system capable of transmitting large volume of data as well as voice at high speed.

One of the methods proposed to solve the problems is Orthogonal Frequency Division Multiplexing (OFDM). A description will now be made of the OFDM technology.

The OFDM technology, a scheme for transmitting data using multiple carriers, is a kind of Multi-Carrier Modulation (MCM) that converts a serial input symbol stream into parallel symbols and modulates each of the parallel symbols with a plurality of orthogonal sub-carriers before transmission. The OFDM technology has the merit of maximizing throughput using a link adaptation algorithm as well as the merit of being robust against frequency selective fading.

Meanwhile, OFDMA, an OFDM-based multiple access scheme, reconfigures some of all possible sub-carriers into a sub-channel and allocates the sub-channel to a particular subscriber station (SS).

The term "sub-channel" as used herein refers to a channel comprised of at least one sub-carrier. The use of OFDMA enables dynamic resource allocation that can dynamically allocate a sub-channel a particular SS according to a fading characteristic of a wireless channel, and an increase in the number of SSs, meaning users, increases multiuser diversity gain.

FIG. 1 is a block diagram illustrating a configuration of a physical layer for data transmission/reception in a general OFDMA system. In FIG. 1, reference numerals 102 through 107 denote a structure of a transmitter, and reference numerals 121 through 127 denote a structure of a receiver.

A transmission input bit stream 101 is input to an encoder 102. The encoder 102 encodes the input bit stream 101 according to a predetermined coding scheme and outputs the coded serial input bit stream to a serial-to-parallel (S/P) converter 103. The S/P converter 103 converts the coded serial input bit stream into a parallel bit stream in order to perform inverse fast Fourier transform (IFFT), and provides the parallel bit stream to an IFFT unit 104. It is assumed herein that the parallel bit stream includes N symbols. The reason for assuming that the IFFT unit 104 receives N-symbol bit stream is because the IFFT unit 104 performs IFFT on the input bit stream in units of N symbols.

The IFFT unit 104 performs IFFT on N transmission symbols received in parallel to convert frequency-domain symbols into time-domain symbols, and outputs the time-domain symbols to a parallel-to-serial (P/S) converter 105. The P/S converter 105 converts the N time-domain symbols received in parallel into a serial stream of N sequential bits. Herein, the stream of N sequential bits will be referred to as an "OFDM symbol."

The OFDM symbol is input to a cyclic prefix (CP) adder 106. The CP adder 106 copies a predetermined number of last bits in the input OFDM symbol, and inserts the copied bits in front of the initial bit of the OFDM symbol, in order to remove an influence of a multipath channel. The CP-added OFDM symbol is input to a digital-to-analog (D/A) converter 107. The D/A converter 107 converts the input digital symbols into analog symbols and transmits the analog symbols to a receiver.

The transmitted analog symbols are received at the receiver via a channel 110 having multiple paths. A description will now be made of a structure and operation of the receiver.

An analog-to-digital (A/D) converter 121 converts the analog signal received over the channel 110 into a digital signal, and outputs the digital signal to a CP remover 122. The CP remover 122 removes CPs contaminated due to the influence of the multiple paths, from the input digital signal, and outputs the CP-removed serial signal to an S/P converter 123, for fast Fourier transform (FFT) unit. The S/P converter 123 parallel-converts the symbols received in series in units of N symbols because the transmitter performed IFFT in units of N symbols.

An FFT unit 124 receives N-symbol parallel data and performs FFT on the received signal to convert time-domain symbols into frequency-domain symbols. The frequency-domain symbols are input to an equalizer 125. The equalizer 125 cancels an influence of the channel 110 from the frequency-domain symbols, and provides its output symbols to a P/S converter 126. The P/S converter 126 converts the parallel input symbols back into serial symbols in units of N symbols, and outputs the serial symbols to a decoder 127 in units of N symbols. The decoder 127 decodes the input symbols into an output bit stream 128.

FIG. 2 is a diagram illustrating an exemplary internal structure of a general AGC circuit. As illustrated in FIG. 2, in the process of designing an OFDMA transceiver, an AGC loop for maintaining received signal strength uniformly should be provided in front of the A/D converter 121 because of time variation of a channel. The AGC circuit includes an A/D converter (ADC) 210, a power measurer 220, an accumulator #1 230, a loop filter 240, a log MAP table 250, an accumulator #2 260, an AGC interface 270, and a variable gain amplifier 200.

In the conventional AGC loop, as shown in FIG. 2, the power measurer 220 receives signals sampled on the time axis from the ADC 210, and accumulates norms of the sampled signals to measure average power for a predetermined time.

The accumulator #1 230 accumulates the average power measured by the power measurer 220 for a predetermined time, and the loop filter 240 loop-filters the accumulated average power. The log MAP table 250 compares the average power output from the loop filter 240 with predetermined reference power for the ADC input, and outputs the resultant comparison value to the accumulator #2 260. The accumulator #2 260 continues to accumulate the comparison value, and outputs the accumulated value to the AGC interface 270. The AGC interface 270 controls a gain of the variable gain amplifier 200 in the analog stage using the accumulated comparison value in such a manner that it provides a digital value obtained from the accumulated comparison value to the variable gain amplifier 200.

With reference to FIG. 3, a description will now be made of a structure of a frame commonly transmitted/received in an OFDMA wireless communication system. FIG. 3 is a diagram illustrating a structure of a general OFDMA frame.

Referring to FIG. 3, an OFDMA frame includes both uplink (UL) information and downlink (DL) information therein, and also includes Transmit Time Gap (TTG) information and Receive Time Gap (RTG) information between the uplink and downlink information. In FIG. 3, the OFDMA frame includes a DL sub-frame for the downlink in its left-hand side and includes a UL sub-frame for the uplink in its right-hand side, and each frame includes a preamble 301 and includes a DL-MAP 302 and a UL-MAP 303 as MAP information.

The DL/UL-MAPs 302 and 303 each divide DL/UL sub-frames for the downlink and the uplink into several intervals and allocate thereto location information of each interval, and a connection identifier (CID) and a Downlink Interval Usage Code (DIUC)/Uplink Interval Usage Code (UIUC) for each interval. Herein, the CID, which is a subscriber identification code, indicates data for which SS the corresponding interval transmits, and the DIUC/UIUC, which is a value indicating usage, modulation type and frame error control (FEC) code, indicates usage of data for the corresponding interval, a modulation type in which the corresponding data is modulated, and an FEC code with which the corresponding data is encoded.

In OFDMA, an allocated sub-channel transmits data along with a pilot signal on a predetermined power level, but a non-allocated sub-channel transmits only the pilot signal and transmission power at a transmission unit differs according to sub-channel allocation information. For example, Partial Usage of Sub-Channels (PUSC) defined in IEEE 802.16e differs in power up to a maximum of 6.4 dB according to sub-channel allocation content. As illustrated in FIG. 3, for one OFDMA frame defined in IEEE 802.16e, if powers of $i^{th}$, $j^{th}$ and $k^{th}$ symbols are denoted by Psym,i, Psym,j, Psym,k, respectively, then power levels of the symbols differ from each other in order of Psym,i>Psym,j>Psym,k according to the sub-channel allocation content.

As described above, an OFDMA system has a wireless communication environment in which transmission power differs according to the sub-channel allocation content. When a signal is received over a channel, a variation in received power on the time axis includes not only a channel variation but also a difference in transmission power. However, in order to restore information carried in a signal level in the frequency domain, the AGC loop should operate such that it compensates only for the variation in channel. To this end, the difference in transmission power should be normalized so that it is not reflected in the AGC loop.

In this context, in the OFDM wireless communication system, because average power at a transmission unit is probably constant during data transmission, a difference between average power calculated on the time axis at a reception unit and reference power reflects a change in channel. However, in the OFDMA system, because transmission power from a transmission unit is not constant on average according to the sub-channel allocation content, average power calculated at a reception unit in the manner of FIG. 2 reflects not only the channel variation but also the difference in transmission power undesirably. This problem affects the process of restoring information carried in the signal level in the frequency domain at the reception unit.

SUMMARY OF THE INVENTION

Therefore, an exemplary object of the present invention is to provide an AGC apparatus and method for correctly reflecting a channel variation in gain control taking into account a difference in transmission power at a reception unit in an OFDMA system.

Another exemplary object of the present invention is to provide an AGC apparatus and method for performing power estimation in a frequency domain at a reception unit in an OFDMA system.

Another exemplary object of the present invention is to provide an AGC apparatus and method for removing an influence caused by a difference in transmission power by performing power estimation on effective sub-carriers in an OFMDA system.

Yet another exemplary object of the present invention is to provide an AGC apparatus and method for maintaining effective bit precision of each sub-carrier by maintaining power of each sub-carrier in the frequency domain at a reception unit in an OFDMA system.

According to an exemplary embodiment of the present invention, there is provided an automatic gain control (AGC) apparatus for maintaining received signal power in an orthogonal frequency division multiple access (OFDMA) system, the AGC apparatus comprise a gain amplifier for amplifying the received signal, a power measurer for measuring power of the received signal in units of sub-carriers, a sub-carrier power accumulator for detecting at least one sub-carrier carrying a signal, and accumulating a power value of the at least one sub-carrier, a sub-carrier average power measurer for estimating an average power value from the accumulated power value, and a control means for comparing the estimated average power value with a reference power value, and for controlling a amplification gain of the gain amplifier according to the comparison result.

According to another exemplary embodiment of the present invention, there is provided an automatic gain control (AGC) method for maintaining received signal power uniformly in an orthogonal frequency division multiple access (OFDMA) system, the method comprise the steps of measuring power of the received signal in units of sub-carriers, detecting at least one sub-carrier carrying a signal among the measured sub-carriers, estimating an average power value from the at least one power of the detected subcarrier; and controlling a gain of a gain amplifier according to the average power wherein the gain amplifier controls an amplification gain of the received signal.

BRIEF DESCRIPTION OF THE DRAWINGS

The above and other exemplary objects, features and advantages of certain exemplary embodiments of the present invention will become more apparent from the following detailed description when taken in conjunction with the accompanying drawings in which like reference numerals will be understood to refer to like parts, components and structures, where:

FIG. 1 is a block diagram illustrating a configuration of a physical layer for data transmission/reception in a general OFDMA system;

FIG. 2 is a diagram illustrating an exemplary internal structure of a general AGC circuit;

FIG. 3 is a diagram illustrating a structure of a general OFDMA frame;

DETAILED DESCRIPTION OF EXEMPLARY EMBODIMENTS

Figure 4:
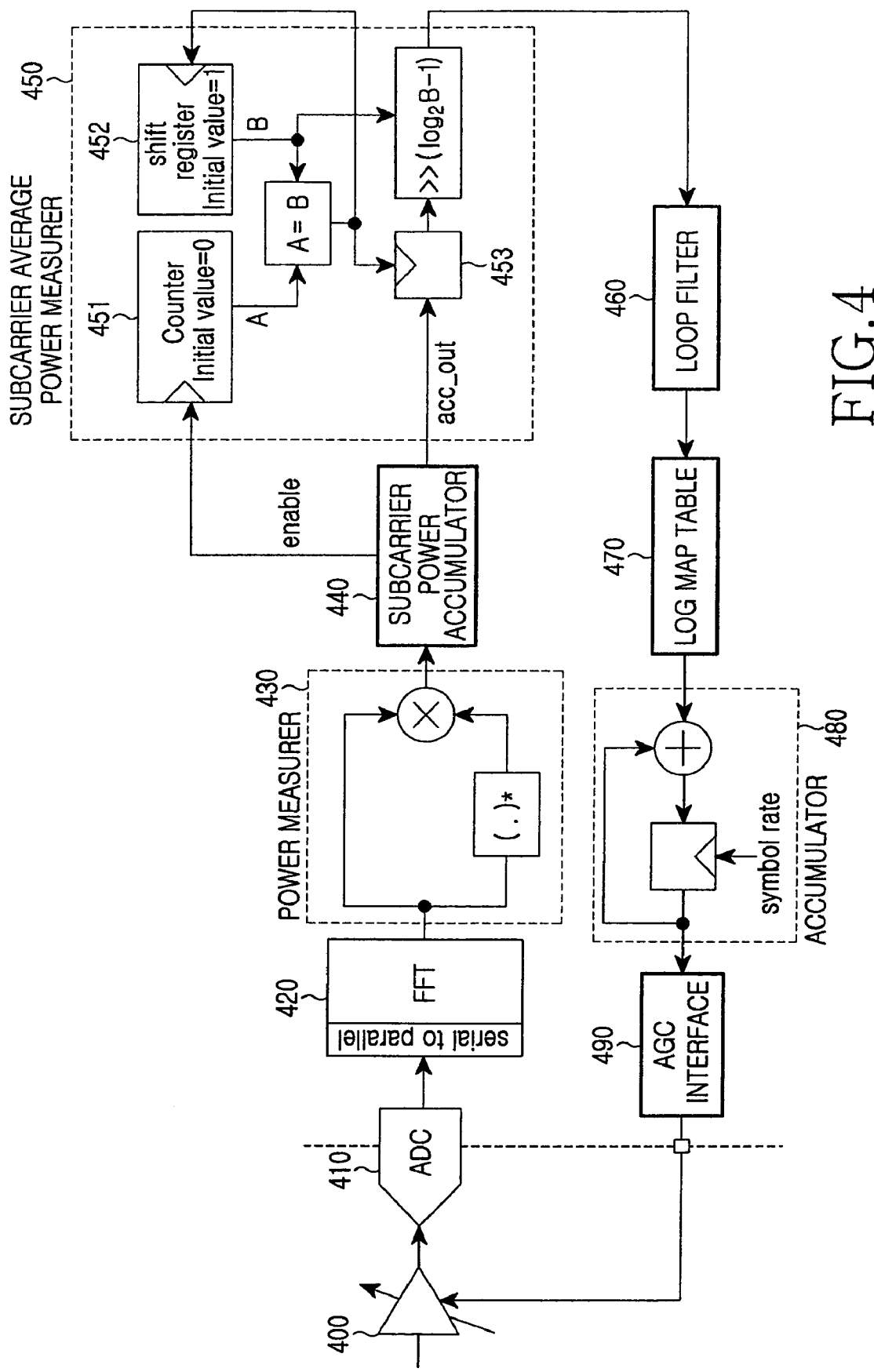
FIG. 4 is a diagram illustrating an internal structure of an AGC circuit for performing power estimation in a frequency domain according to an exemplary embodiment of the present invention.

Exemplary embodiments of the present invention will now be described in detail with reference to the annexed drawings. In the drawings, as noted above, the same or similar elements are denoted by the same reference numerals even though they are depicted in different drawings. In the following description, a detailed description of known functions and configurations incorporated herein has been omitted for clarity and conciseness.

A description will first be made of an exemplary implementation of the present invention. In an OFDMA system, a difference in transmission power is determined according to presence/absence of non-allocated sub-channels. That is, transmission power differs according to whether there is any signal in each sub-carrier in the frequency domain. Therefore, it is possible to maintain constant average power of each sub-carrier in the frequency domain by calculating and AGC-controlling average power of only the sub-carrier in which a signal exists in the frequency domain, so the signal carried in each sub-carrier can maintain substantially the same effective bit precision.

In order to maintain a substantially constant effective bit precision of each sub-carrier, it is also possible to maintain the loop such that it measures power of a pilot signal in the frequency domain and maintains constant power of the pilot signal. However, although the OFDMA system adopted in IEEE 802.16e provides sub-channel allocation information and a sub-channel allocation method in a frame to a terminal through MAP information in an OFDM frame, the terminal receiving the OFDM frame cannot acquire the sub-channel allocation information until it decodes the MAP information received from the system and also cannot be aware of a location of the corresponding pilot signal.

Therefore, a conventional terminal cannot use a method of estimating power which uses the pilot signal unless it postpones power estimation until the time that it buffers the received OFDM frame and decodes MAP information. If the terminal postpones the power estimation until the decoding time, it fails in normal loop operation due to a delay in the power estimation time and the AGC loop reflecting time when it operates at a symbol rate. An embodiment of the present invention proposes a scheme for addressing these problems.

A description will now be made of an exemplary implementation of an AGC apparatus and method, according to certain embodiments of the present invention, for performing power estimation in a frequency domain in an OFDMA system in parallel with power estimation based on a pilot signal and power estimation based on an effective sub-carrier carrying a signal, to substantially remove an influence caused by a difference in transmission power, thereby reflecting only the channel variation in gain control.

With reference to FIG. 4, a description will now be made of a structure of an AGC circuit for performing power estimation in a frequency domain according to an exemplary embodiment of the present invention.

Referring to FIG. 4, a closed-loop AGC circuit according to an exemplary implementation of the present invention includes a variable gain amplifier 400, an ADC 410 for converting an analog signal amplified by the variable gain amplifier 400 into a digital signal, an FFT unit 420 for converting the time-domain signal input from the ADC 410 into a frequency-domain signal, a power measurer 430 for measuring power of the input frequency-domain signal in units of symbols, a sub-carrier power accumulator 440 for detecting an effective sub-carrier carrying a transmission signal and accumulating its signal power, and a sub-carrier average power measurer 450 for estimating an average power transmitted per sub-carrier in the band where a sub-channel is allocated. Further, the AGC circuit includes, as a control means for comparing the estimated average power with a reference power value to generate a control signal used for controlling a gain of the variable gain amplifier 400, a loop filter 460, a log MAP table 470, an accumulator 480 and an AGC interface 490, all of which may have structure and operation analogous to those of the AGC loop shown in FIG. 2.

A detailed description will now be made of each of the elements shown in FIG. 4. The ADC 410 converts received analog symbols into time sampled data. The time-sampled data is an OFDM symbol to which a CP is added, and the CP contaminated due to an influence of multiple paths is removed from the OFDM symbol by a CP remover (not shown). The FFT unit 420 performs FFT on the input time-sampled data to convert it into a frequency-domain signal, and outputs the frequency-domain signal to the power measurer 430. It is assumed herein that the FFT 420 sequentially outputs one signal per sub-carrier. Although the FFT 420 has a structure of outputting all sub-carriers at a time, it can sequentially process the sub-carriers one by one on a time sharing basis.

The power measurer 430 sequentially estimates power for each sub-carrier one by one by calculating a norm of each sub-carrier signal output from the FFT 420 in the frequency domain, and outputs the estimated sub-carrier power to the sub-carrier power accumulator 440. Then the sub-carrier power accumulator 440 detects a corresponding sub-carrier in the frequency domain and accumulates its signal power in different methods for one case where location information of the pilot signal is given and another case where the location information of the pilot signals is not given.

In some cases, the IEEE 802.16e OFDMA system to which certain exemplary implementations of the present invention may be applied can change arrangement of pilot signals in the same frame. That is, a sub-channel allocation method can be changed in the same frame, and sub-channel allocation information including location information of the pilot can be acquired after a MAP is decoded. Therefore, certain exemplary implementations of the present invention perform power estimation in the frequency domain using location information of the pilot when a position of the pilot in each symbol is known due to completion of MAP decoding at the time of calculating a norm. However, for the symbols before the MAP decoding, the present invention performs power estimation in the frequency domain with a method of scanning all sub-carriers using a predetermined threshold.

Figure 5:
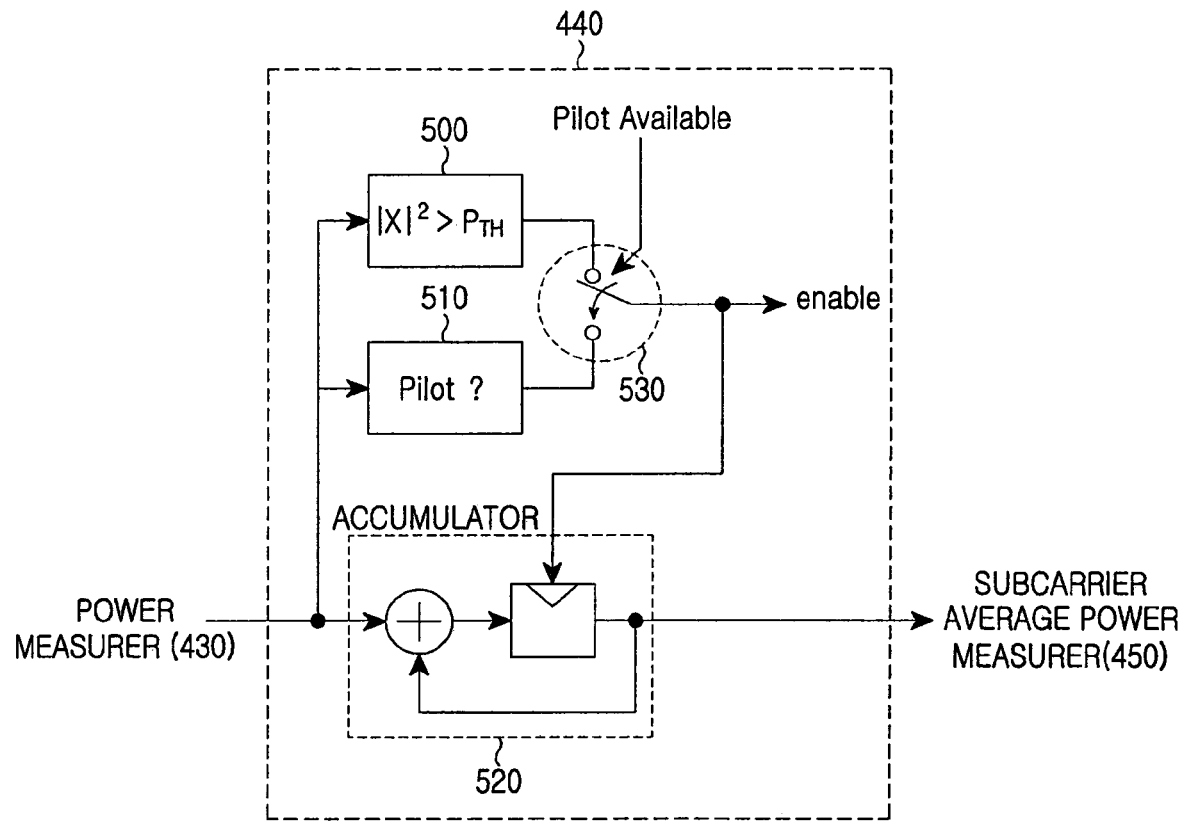
FIG. 5 is a diagram illustrating an internal structure of a sub-carrier power accumulator according to an exemplary embodiment of the present invention.

With reference to FIG. 5, a detailed description will now be made of an exemplary implementation of internal structure and exemplary operation of the sub-carrier power accumulator 440.

The sub-carrier power accumulator 440 includes a sub-carrier detector 500, a pilot signal detector 510, an accumulator 520, and a switch 530. The switch 530 is switched to either one of the sub-carrier detector 500 and the pilot signal detector 510 according to presence/absence of a pilot availability signal received when location information of the pilot can be acquired from the information acquired by decoding a MAP. The pilot availability signal can be received from a controller (not shown) in, for example, the receiver. According to an exemplary implementation of the present invention, the switch 530 is switched to the pilot signal detector 510 for detecting a pilot signal using the location information of the pilot if the pilot availability signal is received. However, if no pilot availability signal is received, the switch 530 is switched to the sub-carrier detector 500 for detecting an effective sub-carrier with the method of scanning all sub-carriers using a predetermined threshold.

A detailed description will now be made of an exemplary implementation of a sub-carrier power accumulating operation separately performed according to presence/absence of the pilot availability signal.

Upon receiving the pilot availability signal, the switch 530 is switched to the pilot signal detector 510 so as to detect a pilot signal using the location information of the pilot. In this case, the measured power signal from the power measurer 430 is input to the accumulator 520 and the pilot signal detector 510. Then the pilot signal detector 510 detects a pilot signal according to the location information of the pilot and outputs an enable signal to the accumulator 520. Upon receipt of the enable signal, the accumulator 520 accumulates power of only the pilot signal in the band where a sub-channel is allocated.

However, if no pilot availability signal is received, the switch 530 is switched to the sub-carrier detector 500 so as to detect an effective sub-carrier using the predetermined threshold. In this case, the measured power signal from the power measurer 430 is input to the accumulator 520 and the sub-carrier detector 500. Then the sub-carrier detector 500 outputs an enable signal to the accumulator 520 only for the sub-carrier exceeding the predetermined threshold in power, and upon receipt of the enable signal, the accumulator 520 accumulates power for the corresponding sub-carrier. That is, the accumulator 520 determines that no sub-channel is allocated to the sub-carrier not exceeding the threshold in power.

As described above, according to an exemplary embodiment of the present invention, the sub-carrier power accumulator 440 of FIG. 5 accumulates power of the sub-carrier to which a sub-channel is allocated, so as to substantially remove an influence caused by a difference in transmission power in the process of performing AGC in the method of excluding the sub-carrier to which no sub-channel is allocated, during average power calculation.

For one symbol output from the sub-carrier power accumulator 440, the sub-carrier average power measurer 450 estimates average power transmitted per sub-carrier in the band where a sub-channel is allocated, by finally dividing the power accumulated by the sub-carrier power accumulator 440 by the number of sub-carriers.

That is, according to an exemplary implementation, the sub-carrier average power measurer 450 should divide the power value accumulated by the sub-carrier power accumulator 440 by the number of sub-carriers used for the accumulation, in order to obtain average power transmitted per sub-carrier. The sub-carrier average power measurer 450, as shown in FIG. 4, is simplified in hardware structure such that it stores an accumulated instantaneous power value for $2^n$ sub-carriers (where n denotes an integer), using a counter 451 and a shift register 452 and performs division with only the shift operations when calculating the average power for sub-carriers per symbol.

Therefore, the sub-carrier average power measurer 450 according to an exemplary implementation of the present invention can be constructed in various ways according to its hardware structure without departing from the teachings of the present invention.

In an exemplary embodiment of the present invention, an initial value of the counter 451 is set to '0' and an initial value of the shift register 452 is set to '1'. The counter 451 increases its count value by 1 each time the instantaneous power value is accumulated. When the count value of the counter 451 is equal to the value stored in the shift register 452, the shift register 452 shifts left its value by 1 bit to increase the value twofold, and the counter 451 is reset to '0'. The accumulated instantaneous power value given at the time when the value stored in the shift register 452 is equal to the count value of the counter 451 is newly stored in a register 453. Accordingly, the sub-carrier average power measurer 450 can measure the accumulated instantaneous power value for $2^n$ sub-carriers, and can find a divisor required when accumulation of instantaneous power is completed for one symbol, from the value stored in the shift register 452 at that time.

An operation of a $\log_2 B - 1$ block in the sub-carrier average power measurer 450 will now be described. The $\log_2 B - 1$ block calculates a right-shift value used for determining the number of sub-carriers used for accumulation to normalize the accumulated power value into power per sub-carrier, and divides the accumulated power value of the register 453 by the number of sub-carriers used for the accumulation. The $\log_2 B - 1$ block can be implemented with a bit shifter. Herein, the reason for subtracting 1 from $\log_2 B$ is to right-shift the left-shifted 1 bit again because the shift register 452 left-shifts its value by 1 bit to double its value for the next count when the number of accumulations of the counter 451 becomes $2^n$. The upper limit of the shift register 452 is appropriately selected within a range of the number of points of the FFT.

Thereafter, the average power value for sub-carriers in the frequency domain, output from the sub-carrier average power measurer 450, is filtered by the loop filter 460. The filtered average power value for the sub-carriers is input to the log MAP table 470, and the log MAP table 470 compares the input average power value for the sub-carriers with a reference power value for the ADC input to calculate a digital value used for controlling an operation of the variable gain amplifier 400, and outputs the resultant comparison value to the accumulator 480. Then the accumulator 480 accumulates the comparison value output from the log MAP table 470 for a predetermined time. The time for which the comparison value is accumulated can be randomly set. For example, the accumulation time can be defined as a one-frame interval for which a predetermined number of symbols are transmitted. Thereafter, the AGC interface 490 controls the variable gain amplifier 400 in the analog stage using the accumulated comparison value. In this case, the AGC interface 490 converts the accumulated comparison value such that the variable gain amplifier 400 receives a digital value acquired from the accumulated comparison value.

As described in FIG. 4, the AGC circuit according to an exemplary implementation can control the variable gain amplifier 400 at a symbol rate or a frame rate using the power estimation method in the frequency domain. A frame-rate AGC loop re-accumulates symbol-based estimated power value for a predetermined symbol interval to control the variable gain amplifier 400 in units of frames, and can apply the above-described method in the same way.

Figure 6:
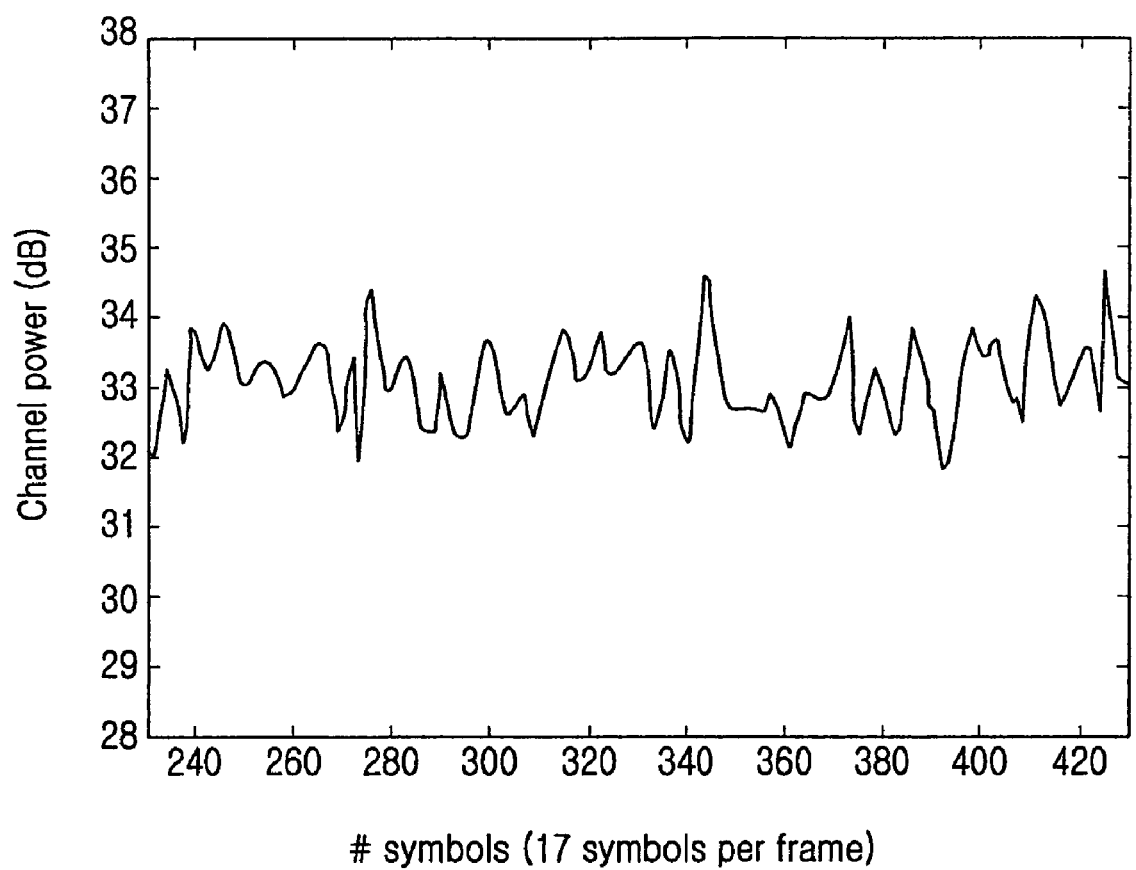
FIG. 6 is a diagram illustrating power input to an ADC in a symbol-rate AGC circuit according to an exemplary embodiment of the present invention.
Figure 7:
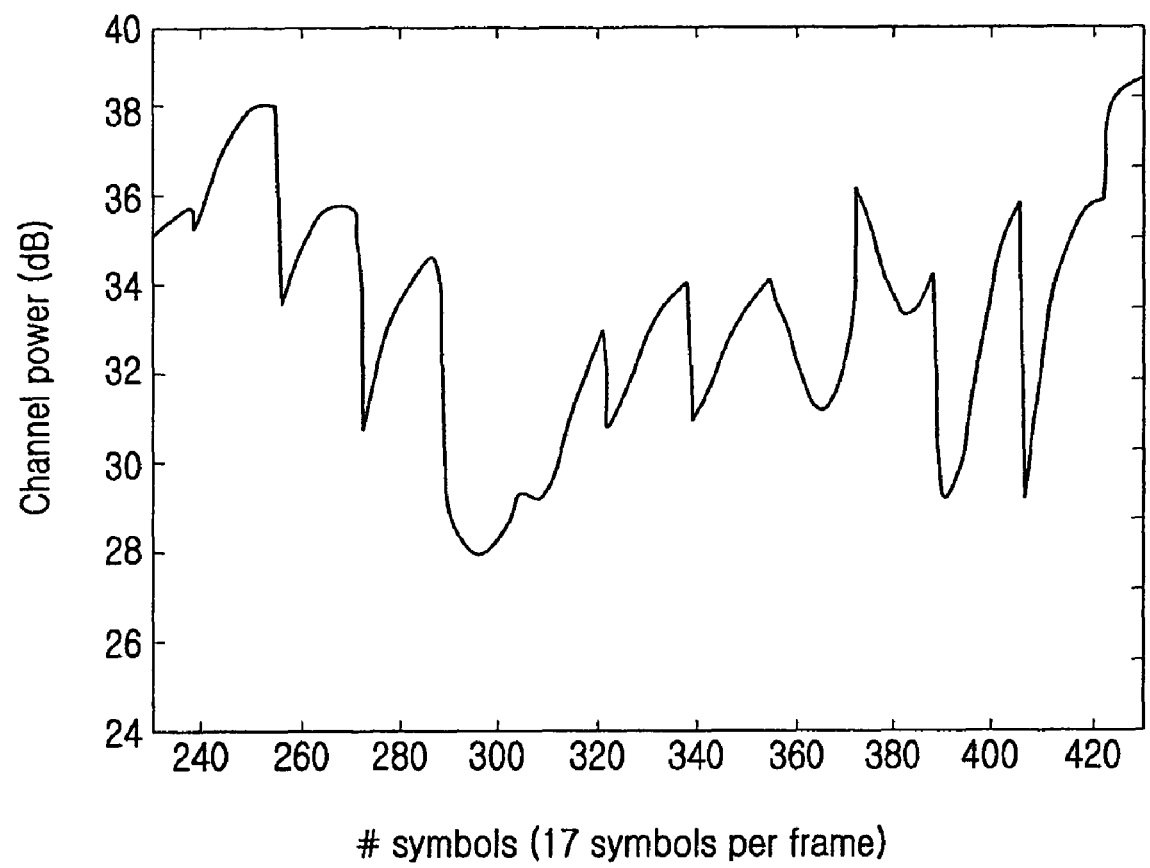
FIG. 7 is a diagram illustrating power input to an ADC in a frame-rate AGC circuit according to an exemplary embodiment of the present invention.

By controlling the variable gain amplifier 400 at a symbol rate, the AGC circuit applies a substantially constant average power to the ADC 410 in units of symbols as shown in FIG. 6. Further, by controlling the variable gain amplifier 400 at a frame rate, the AGC circuit applies a substantially constant average power to the ADC 410 in units of frames as shown in FIG. 7.

As can be understood from the foregoing description, exemplary embodiments of the present invention facilitate removal of an influence caused by a difference in transmission power with a method of performing power estimation using an effective sub-carrier in an OFDMA system, thereby making it possible to reflect the channel variation in gain control.

In addition, certain exemplary embodiments of the present invention perform power estimation based on a pilot signal in the frequency domain in parallel with power estimation based on an effective sub-carrier, thereby reflecting the channel variation in gain control.

Further, certain exemplary implementations of the present invention are applicable to an AGC device for an OFDMA system, and may be used, for example, for an IEEE 802.16e-based Wireless Broadband (WiBro) system or an IEEE 802.16e-based IEEE 802.16d system. Moreover, certain exemplary implementations of the present invention may compensate for channel variation on the time axis in the OFDMA system suffering a change in transmission power, thus improving performance of an OFDMA receiver.

While the invention has been shown and described with reference to certain exemplary embodiment thereof, it will be understood by those skilled in the art that various changes in form and details may be made therein without departing from the spirit and scope of the invention as defined by the appended claims.

What is claimed is:

1. An automatic gain control (AGC) apparatus for maintaining received signal power in an orthogonal frequency division multiple access (OFDMA) system, the AGC apparatus comprising:
   a gain amplifier for amplifying the received signal;
   a power measurer for measuring power of the received signal in units of sub-carriers;
   a sub-carrier power accumulator for detecting at least one sub-carrier carrying a signal, and accumulating a power value of the at least one sub-carrier;
   a sub-carrier average power measurer for estimating an average power value from the accumulated power value based on a pilot signal; and
   a control means for comparing the estimated average power value with a reference power value, and for controlling a amplification gain of the gain amplifier according to the comparison result.

2. The AGC apparatus of claim 1, wherein the power measurer sequentially estimates power for each sub-carrier by calculating a norm of a sub-carrier signal.

3. The AGC apparatus of claim 1, wherein the sub-carrier power accumulator detects a pilot signal using location information of a decoded pilot and accumulates a power value of the detected pilot signal among the power values measured by the power measurer.

4. The AGC apparatus of claim 1, wherein the sub-carrier power accumulator accumulates a power value for a sub-carrier exceeding a threshold value among the power values measured by the power measurer.

5. The AGC apparatus of claim 3, wherein the location information of the pilot signal is acquired from sub-channel allocation information obtained by decoding MAP information transmitted from the system.

6. The AGC apparatus of claim 5, wherein the location information of the pilot signal is acquired when the decoding of the MAP information is completed until the power measurer calculates a norm for the pilot signal.

7. The AGC apparatus of claim 3, wherein the sub-carrier power accumulator comprises:
   a pilot signal detector for detecting the pilot signal using the location information of the decoded pilot and outputting the detected pilot signal; and
   an accumulator for, upon receiving the detected pilot signal, accumulating a power value of the detected pilot signal.

8. The AGC apparatus of claim 4, wherein the sub-carrier power accumulator comprises:
   a sub-carrier detector for outputting a detection signal of the sub-carrier if the power value measured by the power measurer is greater than the threshold value; and
   an accumulator for, upon receiving the detection signal, accumulating a power value of the corresponding sub-carrier.

9. The AGC apparatus of claim 5, wherein the sub-carrier power accumulator comprises a switch for connecting an output terminal of the pilot signal detector to the accumulator when the location information of the pilot signal can be acquired from sub-channel allocation information, and connecting an output terminal of the sub-carrier detector to the accumulator when the location information of the pilot signal cannot be acquired from sub-channel allocation information.

10. The AGC apparatus of claim 1, wherein the sub-carrier average power measurer estimates the average power value by dividing the accumulated power value by the number of sub-carriers used for the accumulation.

11. The AGC apparatus of claim 10, wherein the sub-carrier average power measurer further comprises:
   a counter for counting the number of sub-carriers used for the accumulation; and
   a shift register for calculating the average power value by shifting the accumulated power value in units of $2^n$ sub-carriers, where n denotes an integer.

12. The AGC apparatus of claim 1, wherein the control means comprises:
   a loop filter for filtering the average power value;
   a log MAP table for comparing the average power value with the reference power value to calculate a digital value for controlling an operation of the gain amplifier, and outputting a comparison value corresponding to the digital value;
   an accumulator for accumulating the comparison value for a time period; and
   an interface for converting the accumulated comparison value into a control signal;
   wherein the accumulated comparison value is receivable by the gain amplifier.

13. The AGC apparatus of claim 12, wherein the time period for which the comparison value is accumulated comprises a one-frame interval.

14. An automatic gain control (AGC) method for maintaining received signal power uniformly in an orthogonal frequency division multiple access (OFDMA) system, the method comprising the steps of:
- measuring power of the received signal in units of sub-carriers;
- detecting at least one sub-carrier carrying a signal among the measured sub-carriers;
- estimating an average power value from the at least one power of the detected subcarrier based on a pilot signal; and
- controlling a gain of a gain amplifier according to the average power wherein the gain amplifier controls an amplification gain of the received signal.

15. The AGC method of claim 14, wherein the power measuring step comprises sequentially estimating power for each sub-carrier by calculating a norm of the sub-carrier signal.

16. The AGC method of claim 14, wherein the step of detecting the at least one sub-carrier further comprises:
- detecting a pilot signal using location information of a decoded pilot; and
- accumulating a power value of the detected pilot signal among the measured power values.

17. The AGC method of claim 14, wherein the step of the at least one sub-carrier further comprises, accumulating a power value for a sub-carrier exceeding a predetermined threshold value among the measured power values.

18. The AGC method of claim 16 wherein the location information of the pilot signal is acquired from sub-channel allocation information obtained by decoding MAP information transmitted from the system.

19. The AGC method of claim 18, wherein the location information of the pilot signal is acquired when the decoding of the MAP information is completed until a norm for the pilot signal is calculated.

20. The AGC method of claim 14, wherein the step of estimating the average power value comprises estimating the average power value by dividing the accumulated power value by the number of sub-carriers used for the accumulation.

21. The AGC method of claim 14, wherein the step of estimating the average power value comprises:
- counting the number of sub-carriers used for the accumulation; and
- calculating the average power value by shifting the accumulated power value in units of $2^n$ sub-carriers, where n denotes an integer.

22. The AGC method of claim 14, wherein the step of controlling the gain of the gain amplifier comprises:
- filtering the average power value;
- comparing the average power value with the reference power value to calculate a digital value for controlling an operation of the gain amplifier;
- outputting a comparison value corresponding to the digital value;
- accumulating the comparison value for a time period; and
- converting the accumulated comparison value into the control signal;
  - wherein the accumulated comparison value is receivable by the gain amplifier.

23. The AGC method of claim 22, wherein the time period for which the comparison value is accumulated comprises a one-frame interval.

* * * * *